United States Patent
Wang et al.

(10) Patent No.: US 10,291,241 B2
(45) Date of Patent: May 14, 2019

(54) REFERENCELESS CLOCK AND DATA RECOVERY CIRCUITS

(71) Applicant: Pericom Semiconductor Corporation, Milpitas, CA (US)

(72) Inventors: Jin-sheng Wang, Cupertino, CA (US); Kai Hung Yu, San Jose, CA (US)

(73) Assignee: Diodes Incorporated, Milpitas, CA (US)

(*) Notice: Subject to any disclaimer, the term of this patent is extended or adjusted under 35 U.S.C. 154(b) by 0 days.

(21) Appl. No.: 16/008,860

(22) Filed: Jun. 14, 2018

(65) Prior Publication Data

US 2019/0089361 A1 Mar. 21, 2019

Related U.S. Application Data

(63) Continuation of application No. 15/670,801, filed on Aug. 7, 2017, now Pat. No. 10,027,332.

(51) Int. Cl.
| | |
|---|---|
| H03L 7/08 | (2006.01) |
| H03L 7/089 | (2006.01) |
| H03L 7/087 | (2006.01) |
| H04L 1/00 | (2006.01) |
| H04L 7/027 | (2006.01) |
| H04L 7/00 | (2006.01) |
| H04L 7/033 | (2006.01) |
| H03L 7/099 | (2006.01) |
| H03L 7/091 | (2006.01) |

(52) U.S. Cl.
CPC ............ *H03L 7/0891* (2013.01); *H03L 7/087* (2013.01); *H03L 7/0807* (2013.01); *H03L 7/091* (2013.01); *H03L 7/099* (2013.01); *H04L 1/0082* (2013.01); *H04L 7/0087* (2013.01); *H04L 7/027* (2013.01); *H04L 7/0331* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,560,053 | B1 * | 5/2003 | Ohta | G11B 20/10009 360/26 |
| 8,929,500 | B2 * | 1/2015 | Mukherjee | H04L 7/0016 327/160 |
| 10,027,332 | B1 | 7/2018 | Wang et al. | |
| 2017/0230052 | A1 * | 8/2017 | Jeong | H03L 7/0891 |

OTHER PUBLICATIONS

Razavi, Behzad, "Challenges in the Design of High-Speed Clock and Data Recovery Circuits" IEEE Communications Magazine pp. 94-101, Aug. 2002.
U.S. Notice of Allowance dated Mar. 30, 2018 issued in U.S. Appl. No. 15/670,801.
U.S. Appl. No. 15/670,801, filed Aug. 7, 2017, Wang et al.

* cited by examiner

*Primary Examiner* — Jaison Joseph
(74) *Attorney, Agent, or Firm* — Weaver Austin Villeneuve & Sampson LLP

(57) ABSTRACT

Referenceless clock and data recovery circuits are described that operate to align the clock/data strobe with each data eye to achieve a low bit error rate. The appropriate frequency and phase to be used is determined by an edge counter based frequency error detector and a phase error detector.

24 Claims, 6 Drawing Sheets

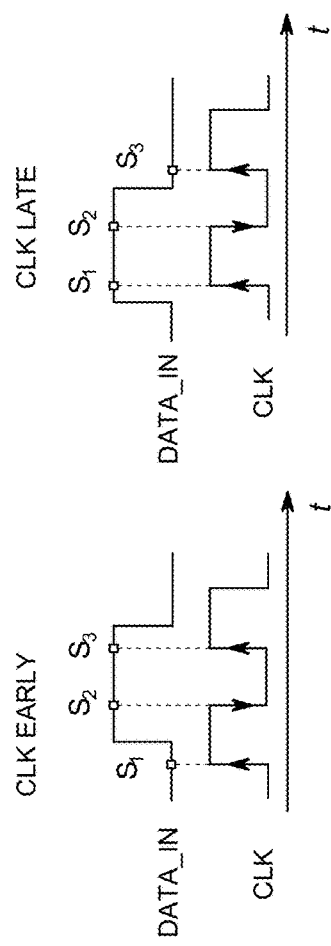
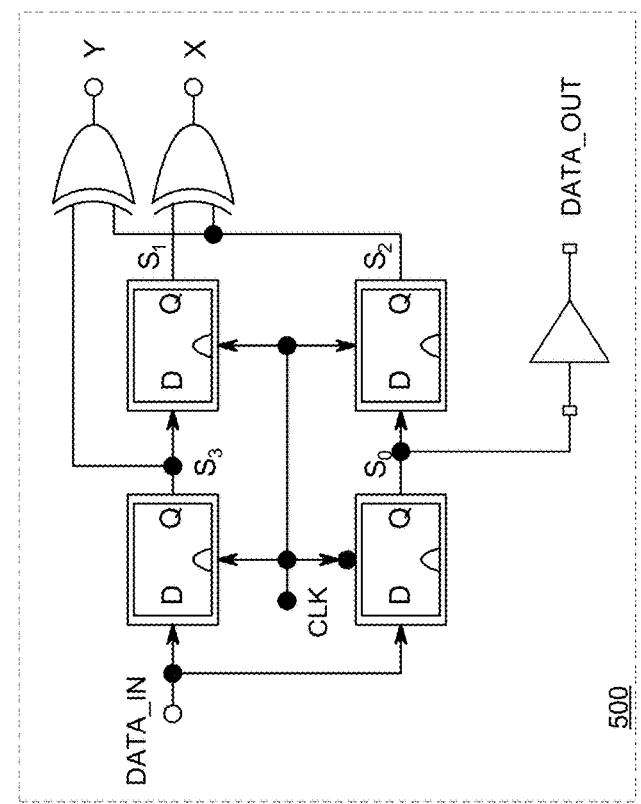
FIG. 5B
FIG. 5C
FIG. 5A

REFERENCELESS CLOCK AND DATA RECOVERY CIRCUITS

RELATED APPLICATION DATA

The present application is a continuation of and claims priority under 35 U.S.C. 120 to U.S. patent application Ser. No. 15/670,801 entitled Referenceless Clock and Data Recovery Circuits filed on Aug. 7, 2017, the entire disclosure of which is incorporated herein by reference for all purposes.

BACKGROUND

With the rapid increase in the volume of data consumption on mobile devices, the need for high bandwidth, compact, and low power receiver circuitry is growing. To support the high data volumes, SERDES (Serializer-Deserializer) circuits must satisfy stringent performance specifications, such as low bit error rates (BERs). Low BERs require CDRs (clock and data recovery circuits) with low jitter components. The rapidly growing throughput speeds for various I/O (input/output) standards is causing CDR design specifications to become more demanding and complicated.

Clock and data recovery is a critical task in serial communication systems. CDR circuits are used in a wide range of applications including transceivers, chip-to-chip interconnects and backplane communications. One objective of CDR circuitry design is to recover the data from the serial input bit stream in an error-free manner that is efficient in terms of power, die area, and cost.

SUMMARY

According to a first class of implementations, a clock and data recovery circuit includes: a receive port configured to receive a received signal generated by a transmitting device, the received signal conforming to a serial data protocol. The clock and data recovery circuit also includes first circuitry including a voltage-controlled oscillator, the first circuitry configured to generate a recovered clock signal for use in generating a recovered data signal from the received signal, the recovered clock signal being generated without reference to a transmitted clock signal associated with the transmitting device, and without reference to a local frequency source. The clock and data recovery circuit also includes second circuitry configured to detect first transitions in the received signal, detect second transitions in the recovered data signal, and generate one or more outputs that represent whether a difference between a number of the first transitions of the received signal and a number of the second transitions of the recovered data signal is within a tolerance. The clock and data recovery circuit also includes third circuitry configured to detect a third transition in the recovered clock signal, detect a fourth transition in the received signal, and generate one or more outputs that represent a timing relationship of the third and fourth transitions. The clock and data recovery circuit also includes fourth circuitry configured to transmit at least one of the one or more outputs of the second circuitry for use in controlling the voltage-controlled oscillator when the difference represented by the one or more outputs of the second circuitry is outside the tolerance, and to transmit one of the one or more outputs of the third circuitry for use in controlling the voltage-controlled oscillator when the difference represented by the one or more outputs of the second circuitry is within the tolerance.

Implementations within the first class of implementations may include one or more of the following features in any suitable combination. The clock and data recovery circuit where the second circuitry includes: a first counter configured to count the first transitions by counting, for the received signal, 1) a number of rising edges, 2) a number of falling edges, or 3) a number of rising and falling edges; a second counter configured to count the second transitions by counting, for the recovered data signal, 1) a number of rising edges, 2) a number of falling edges, or 3) a number of rising and falling edges; and where the second circuitry is configured to: determine a difference between the number of the second transitions and the number of the first transitions in response to either of the number of the first transitions or the number of the second transitions reaching a limit; and compare the difference with a threshold value. The clock and data recovery circuit where the second circuitry includes a third counter configured to synchronize the determining of the difference and the comparing of the difference with the threshold value. The clock and data recovery circuit where the tolerance corresponds to the difference being within about 25% of the number of the first transitions of the received signal. The clock and data recovery circuit where the third circuitry is further configured to generate the recovered data signal by using the recovered clock signal to sample the received signal. The clock and data recovery circuit where the serial data protocol corresponds to one of a DisplayPort standard, a high-definition multimedia interface (HDMI) standard, a serial ATA standard, a peripheral component interconnect express (PCI-E) standard, or a universal serial bus (USB) standard. The clock and data recovery circuit where supported rates for the recovered clock signal range from about 800 MHz to about 20 GHz. The clock and data recovery circuit where the second circuitry is configured to enter a low power consumption mode when the difference represented by the one or more outputs of the second circuitry is within the tolerance, the low power consumption mode being characterized by one or both of 1) the second circuitry not detecting transitions during a first time interval, or 2) the second circuitry detecting only rising edges or only falling edges during a second time interval. The clock and data recovery circuit where the received signal is differential data or single-ended data, and the serial data protocol corresponds to a non-return to zero (NRZ) protocol. The clock and data recovery circuit where the first circuitry further includes a charge pump and a capacitor configured to generate a control voltage for the voltage-controlled oscillator, the charge pump being configured to charge or discharge the capacitor when the difference represented by the one or more outputs of the second circuitry is outside the tolerance. The clock and data recovery circuit where the first circuitry further includes a frequency multiplier for use in generating the recovered clock signal from an output of the voltage-controlled oscillator. The clock and data recovery circuit where the second circuitry is configured to generate the one or more outputs based on a link training sequence associated with the received signal.

According to a second class of implementations, a half-duplex repeater circuit includes: a first port configured to selectively couple to a first communication device or a second communication device to receive a received signal, the received signal conforming to a serial data protocol. The half-duplex repeater circuit also includes a second port configured to selectively couple to the first communication device or the second communication device to transmit a recovered data signal, the recovered data signal conforming to the serial data protocol; a clock and data recovery circuit including: a receive port coupled to the first port, and a transmit port coupled to the second port; first circuitry including a voltage-controlled oscillator, the first circuitry configured to generate a recovered clock signal for use in generating the recovered data signal from the received signal, the recovered clock signal being generated without reference to a transmitted clock signal associated with the first communication device or the second communication device, and without reference to a local frequency source; second circuitry configured to detect first transitions in the received signal, detect second transitions in the recovered data signal, and generate one or more outputs that represent whether a difference between a number of the first transitions of the received signal and a number of the second transitions of the recovered data signal is within a tolerance; third circuitry configured to detect a third transition in the recovered clock signal, detect a fourth transition in the received signal, and generate one or more outputs that represent a timing relationship of the third and fourth transitions; and fourth circuitry configured to transmit at least one of the one or more outputs of the second circuitry for use in controlling the voltage-controlled oscillator when the difference represented by the one or more outputs of the second circuitry is outside the tolerance, and to transmit one of the one or more outputs of the third circuitry for use in controlling the voltage-controlled oscillator when the difference represented by the one or more outputs of the second circuitry is within the tolerance.

Implementations within the second class of implementations may include one or more of the following features in any suitable combination. The half-duplex repeater circuit where the second circuitry is configured to: count the first transitions and the second transitions by counting, for each of the received signal and the recovered data signal, 1) a number of rising edges, 2) a number of falling edges, or 3) a number of rising and falling edges; further where a first counter to count the first transitions and a second counter to count the second transitions each include a digital ripple counter. The half-duplex repeater circuit may also include the second circuitry to determine a difference between the number of the second transitions from the number of the first transitions in response to either of the number of the first transitions or the number of the second transitions reaching a limit. The half-duplex repeater circuit may also include the second circuitry to compare the difference with a threshold value. The half-duplex repeater circuit where the serial data protocol corresponds to one of a DisplayPort standard, a high-definition multimedia interface (HDMI) standard, a serial ATA standard, a peripheral component interconnect express (PCI-E) standard, or a universal serial bus (USB) standard. The half-duplex repeater circuit where the second circuitry is configured to enter a low power consumption mode when the difference represented by the one or more outputs of the second circuitry is within the tolerance, the low power consumption mode being characterized by one or both of 1) the second circuitry not detecting transitions during a first time interval, or 2) the second circuitry detecting only rising edges or only falling edges during a second time interval.

According to a third class of implementations, a full-duplex repeater circuit includes: a first port configured to receive a first received signal generated by a first communication device, the first received signal conforming to a serial data protocol. The full-duplex repeater circuit also includes a second port configured to transmit a first recovered data signal generated from the first received signal to a second communication device, the first recovered data signal conforming to the serial data protocol. The full-duplex repeater circuit also includes a third port configured to receive a second received signal generated by the second communication device, the second received signal conforming to the serial data protocol. The full-duplex repeater circuit also includes a fourth port configured to transmit a second recovered data signal generated from the second received signal to the first communication device, the second recovered data signal conforming to the serial data protocol; a first clock and data recovery circuit including a receive port coupled to the first port, and a transmit port coupled to the second port; a second clock and data recovery circuit including a receive port coupled to the third port, and a transmit port coupled to the fourth port; each of the first clock and data recovery circuit and the second clock and data recovery circuit including a respective. The full-duplex repeater circuit also includes first circuitry including a voltage-controlled oscillator, the first circuitry configured to generate a recovered clock signal for use in generating a recovered data signal from a received signal, the recovered clock signal being generated without reference to a transmitted clock signal associated with the first communication device or the second communication device, and without reference to a local frequency source. The full-duplex repeater circuit also includes second circuitry configured to detect first transitions in the received signal, detect second transitions in the recovered data signal, and generate one or more outputs that represent whether a difference between a number of the first transitions of the received signal and a number of the second transitions of the recovered data signal is within a tolerance. The full-duplex repeater circuit also includes third circuitry configured to detect a third transition in the recovered clock signal, detect a fourth transition in the received signal, and generate one or more outputs that represent a timing relationship of the third and fourth transitions. The full-duplex repeater circuit also includes fourth circuitry configured to transmit at least one of the one or more outputs of the second circuitry for use in controlling the voltage-controlled oscillator when the difference represented by the one or more outputs of the second circuitry is outside the tolerance, and to transmit one of the one or more outputs of the third circuitry for use in controlling the voltage-controlled oscillator when the difference represented by the one or more outputs of the second circuitry is within the tolerance.

Implementations within the third class of implementations may include one or more of the following features in any suitable combination. The full-duplex repeater circuit where the respective second circuitry for the first clock and data recovery circuit and the second clock and data recovery circuit is configured to: count the first transitions and the second transitions by counting, for each of the received signal and the recovered data signal, 1) a number of rising edges, 2) a number of falling edges, or 3) a number of rising and falling edges; further where a first counter to count the first transitions and a second counter to count the second transitions each include a digital ripple counter. The full-duplex repeater circuit may also include the respective second circuitry to determine a difference between the number of the second transitions from the number of the first transitions in response to either of the number of the first transitions or the number of the second transitions reaching a limit. The full-duplex repeater circuit may also include the respective second circuitry to compare the difference with a threshold value. The full-duplex repeater circuit where the serial data protocol corresponds to one of a DisplayPort standard, a high-definition multimedia interface (HDMI) standard, a serial ATA standard, a peripheral component interconnect express (PCI-E) standard, or a universal serial bus (USB) standard. The full-duplex repeater circuit where the respective second circuitry for the first clock and data recovery circuit and the second clock and data recovery circuit is configured to enter a low power consumption mode when the difference represented by the one or more outputs of the second circuitry is within the tolerance, the low power consumption mode being characterized by one or both of 1) the second circuitry not detecting transitions during a first time interval, or 2) the second circuitry detecting only rising edges or only falling edges during a second time interval.

A further understanding of the nature and advantages of various implementations may be realized by reference to the remaining portions of the specification and the drawings.

BRIEF DESCRIPTION OF THE DRAWINGS

FIG. 5A is a simplified block diagram of a specific implementation of a phase error detector.

FIG. 5B is an illustration of signal states of the phase error detector of FIG. 5A.

FIG. 5C is a further illustration of signal states of the phase error detector of FIG. 5A.

DETAILED DESCRIPTION

Reference will now be made in detail to specific implementations. Examples of these implementations are illustrated in the accompanying drawings. These examples are provided for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

Transmission protocols used to transmit serial data between connected devices are constantly in the process of being revised with new and improved versions being deployed every few years. Examples of such protocols include the DisplayPort standard, the High-Definition Multimedia Interface (HDMI) standard, the Serial ATA standard, the Peripheral Component Interconnect Express (PCI-E) standard, and the Universal Serial Bus (USB) standard. The new and improved versions of the transmission protocols often require more complex circuit implementations that increase semiconductor die area and power consumption. While the continued evolution of these and other protocols is generally desirable, it is important to provide circuit designs that reduce semiconductor die area and power consumption.

Clock and data recovery circuits for receiving data in accordance with serial data protocols are described. The "referenceless" clock and data recovery circuits enabled by the present disclosure are circuits for receiving serial data and recovering clock and data signals without the use of a reference oscillator. The frequency to be used for sampling incoming data is determined using the output(s) of a counter-based frequency error detector. The phase to be used for sampling incoming data is determined using the output(s) of a phase error detector. The output(s) of the phase error detector is (are) gated by digital logic circuitry based on the output(s) of the frequency error detector. This eliminates the risk of instability caused by mismatches in the frequency loop and phase loop filters typically included in conventional CDR circuits. Some examples will be illustrative.

Figure 1A:
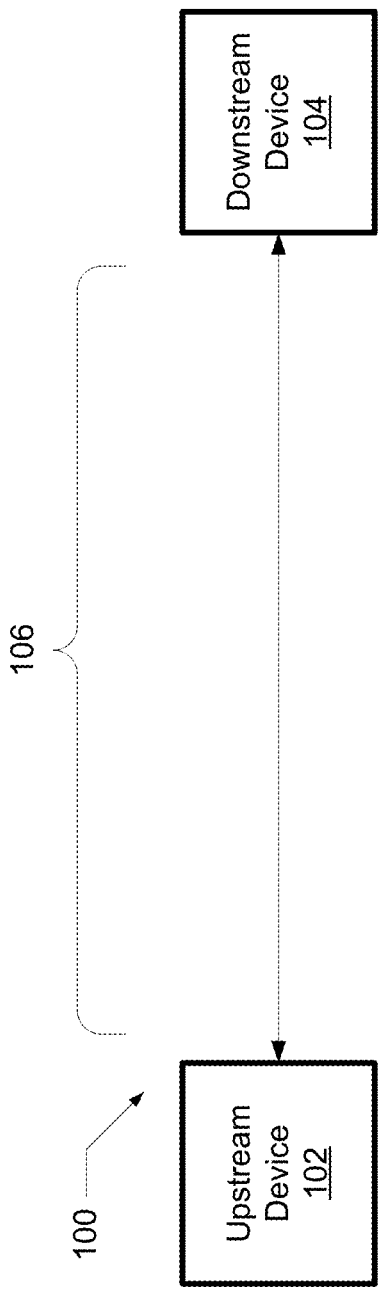
FIG. 1A is a simplified block diagram of a serial data transmission system.

FIG. 1A is a block diagram depicting an example of an implementation of a serial bus communication system 100. Serial bus communication system 100 includes upstream device 102, downstream device 104, and serial bus 106. It should be appreciated that serial bus communication system 100 may be a bidirectional communication system, where the upstream device 102 is capable of both transmitting and receiving, and the downstream device 104 is capable of both transmitting and receiving. In bidirectional communication systems, both upstream device 102 and downstream device 104 include the referenceless clock and data recovery circuit described herein. It should also be appreciated that bidirectional implementations of serial bus communication system 100 include full-duplex implementations with two clock and data recovery circuits, and half-duplex implementations with one clock and data recovery circuit and switching interfaces for the transmit and receive ports. It should further be appreciated that serial bus communication system 100 may be a unidirectional communication system, where upstream device 102 is capable of transmitting and downstream device 104 is capable of receiving, or where upstream device 102 is capable of receiving and downstream device 104 is capable of transmitting. In unidirectional communication systems, the receiver, whether in upstream device 102 or downstream device 104, includes the referenceless clock and data recovery circuit described herein.

Figure 1B:
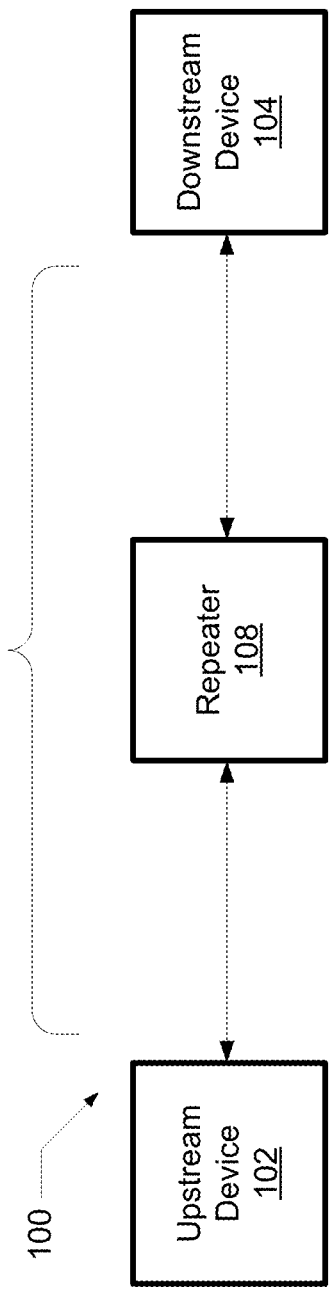
FIG. 1B is a simplified block diagram of a serial data transmission system including a repeater.

FIG. 1B is a block diagram depicting an example in an implementation where serial bus 106 includes one or more intermediary signal conditioning devices (singly and collectively "repeater 108") coupled in series. It should be appreciated that a single repeater 108 may be used in serial bus 106 depending on trace or cable length of the serial bus. For purposes of clarity and not limitation, it shall be assumed that traces are used. Thus, repeater 108 may be used as a serial link driver interface for serial bus 106, or multiple repeaters 108 may be used to provide a serial link driver interface for serial bus 106. Additionally, it should be appreciated that serial bus 106 includes traces formed in a transmission medium such as conductive material or other means for propagating electric signals. It should also be appreciated that for implementations in which multiple repeaters 108 are used, one or more of the multiple repeaters may be a repeater including the referenceless clock and data recovery circuits as described herein. It should further be appreciated that implementations of serial bus communication system 100 including one or more repeaters may be full-duplex bidirectional, half-duplex bidirectional, or unidirectional as described for FIG. 1A.

Upstream device 102 may be implemented in a larger device or system such as any in a variety of integrated circuits or devices including, but not limited to, input/output ("I/O") hubs, root complexes, servers, and laptop docking stations, among others. Furthermore, it should be appreciated that downstream device 104 may be embedded in a larger device or system such as any in a variety of peripheral devices including, but not limited to, hard disk drives, graphics cards, and daughter cards, among others. It should be appreciated that reference to upstream device and downstream device are for example purposes, and the examples of upstream device 102 and downstream device 104 listed above can correspond to terminal communication devices for serial standards that do not utilize a host-slave or hierarchical topology.

Communication via serial bus 106 may use a differential or single-ended signaling protocol. For example, upstream device 102 may include a differential output driver (not shown) for providing a differential signal. Repeater 108, when present, processes an output transmission from upstream device 102 to provide such processed output transmission to another repeater or directly to downstream device 104. Downstream device 104 may include a differential input driver (not shown). There are many known differential digital signaling protocols that may be used with serial bus communication system 100 such as, for example, differential Stub-Series Terminated Logic ("SSTL"), differential High-Speed Transceiver Logic ("HSTL"), Low-Voltage Differential Signaling ("LVDS"), differential Low-Voltage Positive Emitter Coupled Logic ("LVPECL"), and Reduced Swing Differential Signaling ("RSDS") among other differential digital signaling protocols. Additionally, implementations are contemplated that use single-ended serial interface protocols such as, for example, Low Voltage Transistor-Transistor Logic ("LVTTL") such as used for PCI, and Low Voltage Complementary Metal Oxide Semiconductor ("LVCMOS"), among other single-ended serial interface protocols. Conventionally PCI uses an LVTTL input buffer and a push-pull output buffer.

Figure 2:
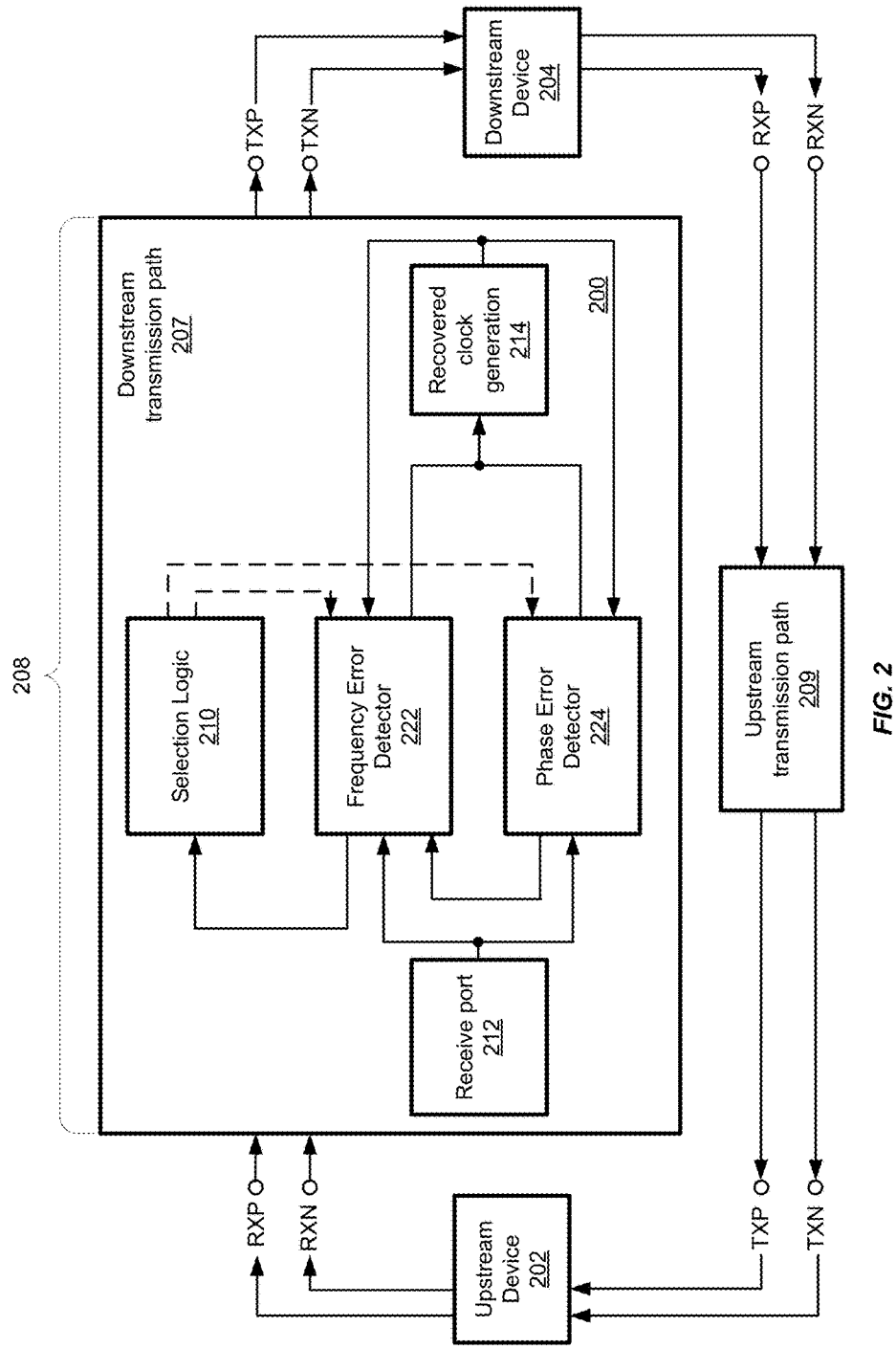
FIG. 2 is a simplified block diagram of a specific implementation of a clock and data recovery circuit in a repeater.

FIG. 2 is a simplified block diagram in a repeater 208 having a referenceless clock and data recovery circuit 200 that operates to align the clock/data strobe with incoming data to achieve a low bit error rate. Clock and data recovery circuit 200 includes receive port 212 for receiving from signal conditioning circuitry (not shown) a differential signal corresponding to the signals RXP and RXN output by the upstream device 202. In certain implementations, RXP and RXN use non-return to zero (NRZ) signaling. The connections between blocks within repeater 208 are depicted with single lines for clarity, but it will be understood that they may represent single-ended or differential signals depending on the implementation. Clock and data recovery circuit 200 further includes frequency error detector 222 and phase error detector 224, each configured to receive the incoming signal from receive port 212. Frequency error detector 222 and phase error detector 224 are also each configured to provide outputs to recovered clock generation circuitry 214 for use in generation of a recovered clock signal. Clock and data recovery circuit 200 also includes selection logic 210 for controlling whether the outputs of the frequency error detector 222 or the phase error detector 224 are to be provided to recovered clock generation circuitry 214. It should also be noted that FIG. 2 only shows downstream transmission path 207 from upstream device 202 to downstream device 204. However, it will be understood that upstream transmission path 209 can include substantially identical circuitry for reception of serial data from downstream device 204 to upstream device 202. It should also be noted that the incoming data may be differential or single-ended data. It should further be noted that FIG. 2 depicts clock and data recovery circuitry 200 as being in an intermediary signal conditioning device, such as in repeater 208 positioned between upstream device 202 and downstream device 204. However, it should be noted that clock and data recovery circuitry 200 as described herein can be included in the receiver circuitry of downstream device 204, or the receiver circuitry for upstream device 202.

It should again be noted that the principles described with reference to the example described herein are generally applicable to high-speed serial interfaces including, for example, referenceless clock and data recovery circuits implemented according to the DisplayPort standard, the HDMI standard, the Serial ATA standard, and the PCI-E standard. The scope of the present disclosure should therefore not be limited by reference to the examples described herein.

A conventional reference-based clock and data recovery circuit consists of a frequency-locked loop (FLL) and a phase-locked loop (PLL). A reference clock generated by a crystal oscillator is used in the FLL to drive the VCO frequency towards the incoming data rate. After frequency acquisition, the PLL achieves phase lock and the VCO clock is driven to the center of the data eye of the incoming data. Two separate loop filters, one for the PLL and one for the FLL, independently set the loop dynamics of the PLL and FLL, respectively. While a reference-based CDR can simplify CDR design, the need for a crystal oscillator generates additional cost. Furthermore, the CDR operating range is limited to frequencies determined by the frequency divider ratio and available crystal frequencies. Moreover, ensuring a stable and smooth transition between the frequency loop and phase loop, as well as the area and power overhead of the second loop, are disadvantages.

Additionally, the presence of analog loop filters pose implementation difficulties. Large capacitors in the order of nano farads are needed to meet the low jitter requirements of serial standards. Such capacitors when implemented on chip consume a large area, are process, voltage, and temperature sensitive, and when implemented using high density capacitors, are prone to leakage. External capacitors used to overcome these issues increase space requirements.

A referenceless CDR as enabled by the present disclosure eliminates the need for an additional clock source, such as a crystal oscillator. An example of an application where a referenceless CDR design is advantageous is a repeater for either optical or copper transmission in which the space and pin count are constrained such that it is difficult to accommodate an external crystal oscillator. Moreover, incorporating a low-noise, rate-adjustable crystal oscillator potentially increases the overall cost and complexity of the receiver design itself.

Figure 3:
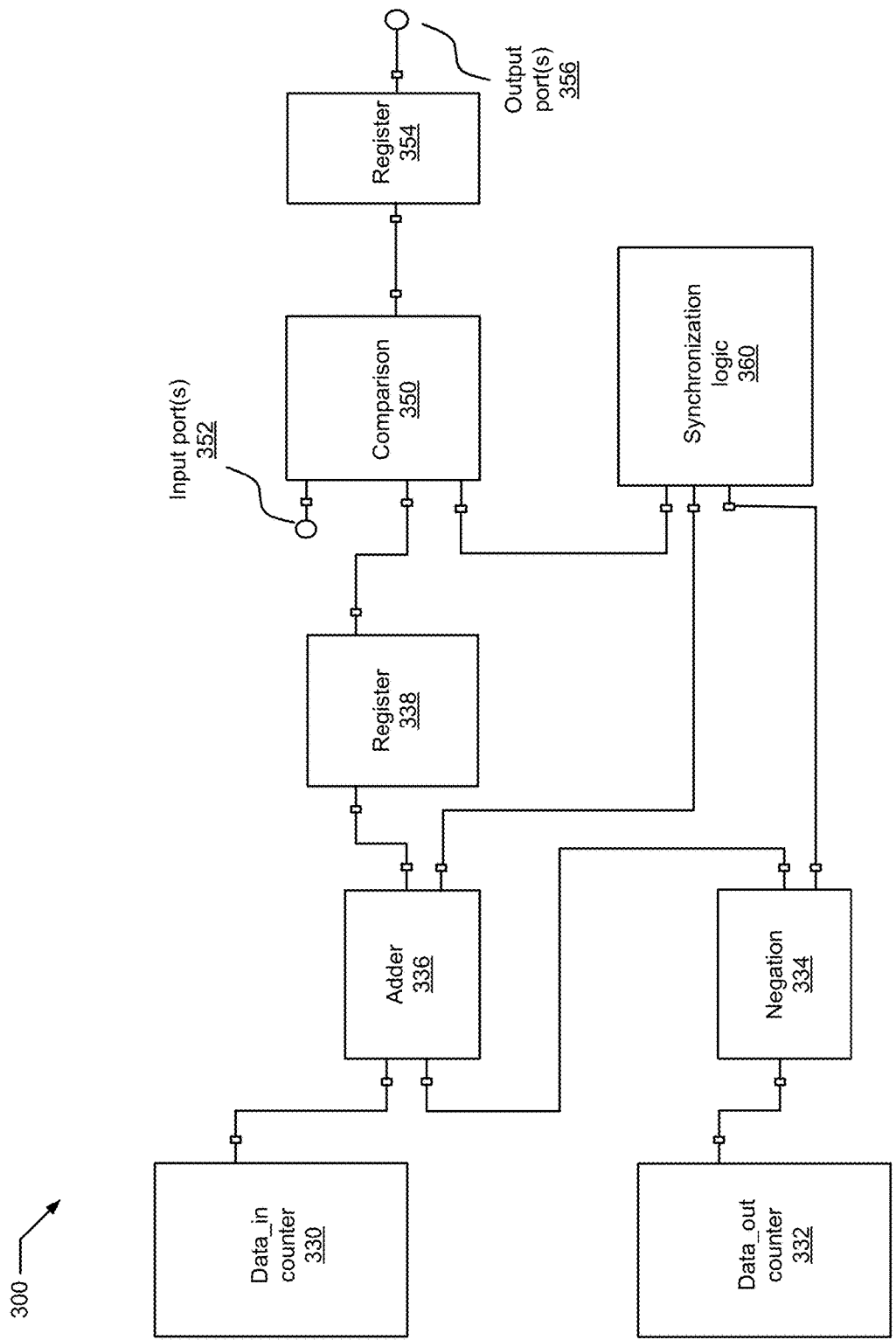
FIG. 3 is a simplified block diagram of a specific implementation of a frequency error detector.

FIG. 3 is an illustrative implementation of a frequency error detector in a referenceless clock and data recovery circuit. Frequency error detector 300 includes counter 330 that receives a signal corresponding to an incoming data signal, and counter 332 that receives a signal corresponding to a recovered data signal. Counter 330 and counter 332 include register-type circuit elements such as flip-flops. It should be appreciated that different types of flip-flops and different numbers of cascaded flip-flops (e.g., n cascaded flip-flops for an n-bit counter) can be used to implement counter 330 and counter 332.

Figure 4A:
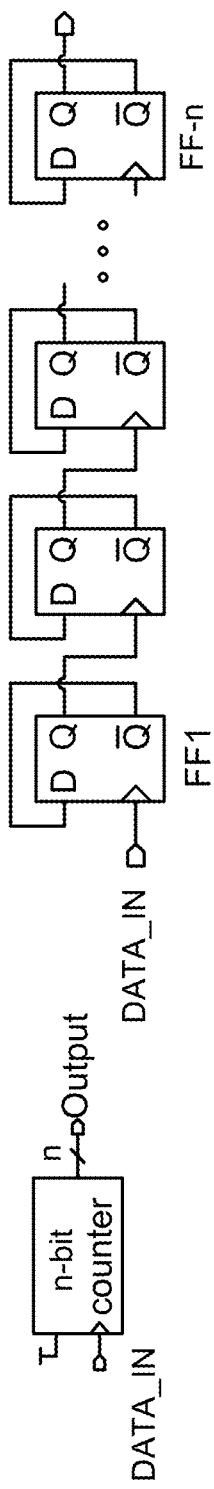
FIG. 4A is a simplified block diagram of a specific implementation of an edge counter in a frequency error detector.

In one implementation, counter 330 and counter 332 are implemented as asynchronous counters. FIG. 4A is an illustrative example of an implementation of an n-bit asynchronous (ripple) counter for counter 330 and counter 332. Returning to FIG. 3, it should be appreciated that counter 330 and counter 332 can use any number base such as, for example, binary or decimal. It should further be appreciated that counter 330 and counter 332 can be configured to respectively count rising edges, falling edges, or both rising and falling edges. In some implementations, counter 330 and counter 332 can operate in a first mode that counts both rising and falling edges, and can be reconfigured to operate in a second mode that counts only rising edges or only falling edges, thereby conserving power.

Frequency error detector 300 also includes negation circuitry 334 to invert the sign of a value output from counter 332, and adder circuitry 336 for obtaining a sum of the output of counter 330 and the output of negation circuitry 334. The output of adder circuitry 336 represents the difference between the outputs of counter 330 and counter 332. It should be appreciated that other circuit designs for determining a difference can be used. Register 338 stores the difference between the outputs of counter 330 and counter 332. It should be appreciated that other circuit designs capable of storing a state can be used in place of a register. Comparison circuitry 350 provides an output indicating whether or not the difference between the outputs of counter 330 and counter 332 stored in register 338 exceeds a threshold value provided at input port 352. It should also be appreciated that the output of comparison circuitry 350 can include multiple signals, such as a LEAD and a LAG signal, each having a respective one of a multiple of register 354 for storing each signal state. In implementations using LEAD and LAG, the signals collectively indicate whether the difference exceeds the threshold, and whether counter 332 leads (counts more edges) or lags (counts fewer edges) relative to counter 330.

As an example implementation, counter 330 outputs 1024, and counter 332 outputs 900, which represents a scenario where DATA_OUT is lagging. In such a scenario, register 338 stores the difference of 124. If the threshold value at input port 352 is 5% of the output of counter 330 (1024*0.05=51.2), the output of comparison circuitry 350 indicates that the difference stored in register 338 is above the threshold value, and register 354 outputs an active value for a LAG signal.

If the threshold value at input port 352 is 1% of the output of counter 330 (1024*0.01=10.24), the output of comparison circuitry 350 indicates that the difference stored in register 338 is below the threshold value. It should be appreciated that the value at input port 352 may be dynamically calculated as a percentage of either the output of counter 330 or counter 332, or may be a static value. It should also be noted that different implementations may use different percentage values, such as 1%, 5%, or 25%, but the percentage value is selected so as to prevent false locking onto harmonics.

Register 354 stores the output of comparison circuitry 350. The output of register 354, a frequency error estimate at output port 356, represents an error caused by the frequency deviation between the clock frequency (i.e., the data rate, such as 10 Gbps) of an incoming data signal at counter 330, and the clock frequency of a signal recovered from the incoming data signal. The frequency deviation exists in part because the frequency of a VCO that drives the circuitry for sampling the incoming random data signal may be different than the clock frequency of the incoming random data signal. Process, temperature, and voltage variations shift the VCO frequency, causing frequency offset between clock and data signals.

Frequency error detector 300 includes synchronization logic circuitry 360 that synchronizes the operations of adder circuitry 336, negation circuitry 334, and comparison circuitry 350. For example, synchronization logic circuitry 360 coordinates the resetting of counter 330 and counter 332.

It should be appreciated that the output of counter 330 is not a determination of the clock frequency in Hz of the incoming data signal at the input of the counter, but instead represents a fraction of the clock frequency, the fraction being based on the transition density of the incoming data signal. The transition density is the number of transitions in the data signal divided by the bit length of the data signal. It should further be appreciated that the output of register 354 is not a determination of the frequency deviation in Hz between the clock frequencies for the signals provided to counter 330 and counter 332, but instead represents the deviation in counted edges.

Figure 4B:
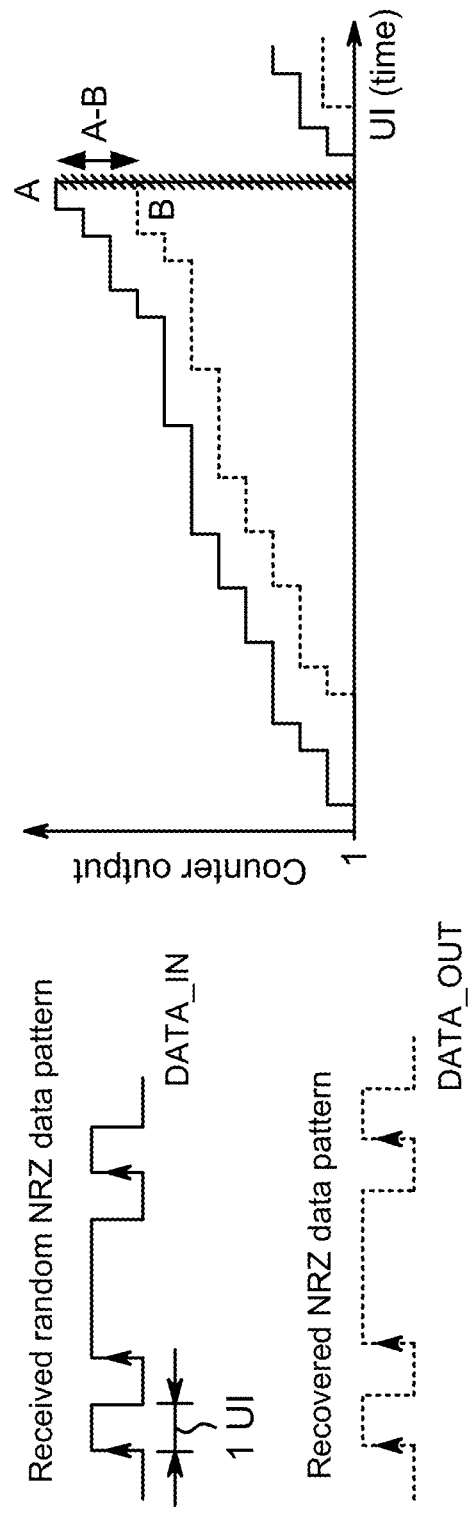
FIG. 4B is an illustration of determining the difference between the outputs of two edge counters.

FIG. 4B is an illustration of one example of operation of counter 330 and counter 332. Over a time interval for a received non-return to zero (NRZ) data pattern, counter 330 accumulates a value representing the number of edges (e.g., rising, falling, or rising and falling) counted up to a particular time. This is represented in FIG. 4B by the solid staircase trace. The progressive increase in the vertical y-axis as time elapses, as represented by the horizontal x-axis, indicates the accumulation of edges counted in counter 330. At the end of a particular time interval, indicated by the vertical crosshatched line, the accumulated value is represented by A. Similarly, counter 332 accumulates a value representing the number of edges counted up to a particular time for a recovered data signal. This is represented in FIG. 4B by the dashed staircase trace. At the end of the particular time interval indicated by the same vertical crosshatched line, the accumulated value is represented by B.

As shown in FIG. 4B, the different values of A and B correspond to different numbers of counted edges, resulting in a nonzero difference that will be calculated by adder circuitry 336 and negation circuitry 334, stored in register 338, and provided as one of the inputs for comparison circuitry 350.

The different values of A and B arise from the frequency deviation between the clock frequency of the incoming data signal at counter 330, and the clock frequency of the recovered data signal at counter 332. As described earlier, the frequency deviation exists in part because the VCO frequency that drives the sampling circuitry for generating the recovered random data signal may be different than the clock frequency used by the transmitter to generate the received random data signal.

As a further illustration of the operation of frequency error detector 300, FIG. 4B depicts a solid trace DATA_IN representing a received random NRZ data pattern and a dashed trace DATA_OUT representing a data pattern recovered from the received random NRZ data pattern. Because of a frequency deviation between the clock that was used to generate DATA_IN and the clock that was used to generate DATA_OUT, the third rising edge in DATA_OUT occurs later than the third rising edge in DATA_IN. As a result, immediately after the third rising edge in DATA_IN, counter 330 and counter 332 will have different respective outputs for A and B. While the output of counter 332 will eventually catch up at the next transition, if the frequency deviation is sufficiently large, at the end of a particular time interval, the output of counter 332 will not catch up entirely, and therefore a difference between A and B will remain.

A large magnitude in the difference between A and B corresponds to a greater clock frequency deviation, relative to a small magnitude in the difference between A and B. When the output of the comparison circuitry 350 indicates that the difference between A and B exceeds the threshold provided at input port 352, the VCO frequency is adjusted to decrease the magnitude of the difference.

Returning to the previous example, counter 330 outputs 1024, counter 332 outputs 900, and register 338 stores the difference of 124. If the threshold value at input port 352 is 5% of the output of counter 330 (1024*0.05=51.2), the output of comparison circuitry 350 indicates that the difference stored in register 338 is above the threshold value. As a result, the control signal for the VCO is driven by the output of frequency error detector 300 to increase the VCO frequency. The counters are reset, the edges are counted again, and then compared. Continuing the example, counter 330 now outputs 1024, and counter 332 outputs 950, and register 338 stores the difference of 74. Since the new difference is still above the threshold, the output of the frequency error detector 300 is still used to drive the control signal for the VCO to increase the VCO frequency.

Further continuing the example, as the VCO frequency continues to be increased, counter 330 outputs 1024, and counter 332 outputs 974, and register 338 stores the difference of 50. Now, the output of comparison circuitry 350 indicates that the difference stored in register 338 is below the threshold value. As a result, the control signal for the VCO is no longer driven by the output of the frequency error detector 300 to increase the VCO frequency. Instead, the control signal for the VCO is now being provided from the phase error detector 224 to achieve phase lock. It should be appreciated that frequency error detector 300 operates in a similar manner to reduce the VCO frequency when the VCO frequency leads the clock frequency of the received signal.

In some implementations, counter 330 and counter 332 are reset after a particular time interval, such as the time interval represented by the vertical crosshatched line. In other implementations, counter 330 and counter 332 are reset after one of the counters reaches a maximum value, such as a value corresponding to $2^n$ for a n-bit counter. Once reset, the edge count values for counter 330 and counter 332 begin to increment again, as depicted by the partial solid staircase trace and dashed staircase trace on the far right of FIG. 4B.

In some implementations, the output of frequency error detector 300 is based on the results of aggregating multiple comparison operations. For example, the frequency error estimate at output port 356 can correspond to an average, a maximum, a minimum or other characteristic of the n most recent outputs of comparison circuitry 350. In one implementation, at least the four most recent outputs of comparison circuitry 350 must all indicate that the difference is below the threshold for frequency lock to be determined.

FIG. 5A is an exemplary implementation of a phase error detector 500. A phase error detector, or phase detector, generates an output representing the difference in phase between two inputs. In a phase locked loop (PLL), there is a transition of the reference clock for every transition of the recovered clock. In contrast, in a CDR, the transitions of the incoming data signal are arbitrary, even if the data signals are scrambled or encoded to increase the transition density. The phase detector design for a CDR is different from a phase detector for a PLL. Specifically, phase detectors used in PLLs trigger on every falling (or rising) edge of each input. For example, if the output of the VCO lags the reference clock, an UP signal will go high until a transition of the reference clock, which resets the flip-flops. This high value for the UP signal causes the control voltage for the VCO to change to reduce the phase error. For a CDR, to prevent the phase detector from interpreting a lack of a transition as a large phase error, the phase detector outputs indicate to logic circuitry controlling a charge pump whether there is a data transition.

Phase error detector 500 can be implemented using either linear phase detectors or binary (bang-bang) phase detectors. The two classifications differ in regards to phase detector gain. A linear phase detector applies an error signal proportional to the size of the phase error, whereas a binary phase detector only accounts for the sign (positive or negative) and applies the same amplitude of correction regardless of the amplitude of the phase error.

The example of the phase error detector in FIG. 5A is a binary phase detector using an Alexander-type phase detector design as described in *Challenges in the design of high-speed clock and data recovery circuits*, B. Razavi, IEEE Communications Magazine (Volume: 40, Issue: 8, August 2002), which is incorporated in its entirety by reference. The Alexander-type phase detector provides samples of the recovered signal that do not require phase offsets to determine the phase error, and provides binary outputs that simplify integration with digital logic for selecting between the outputs of the phase detector or the outputs of frequency error detector 300, Four flip-flops clocked by a CLK signal derived from the VCO output, $S_0$ through $S_3$, store values that correspond to three sample values for determining the phase offset, and a value corresponding to the recovered data value DATA_OUT, which is also provided to the frequency error detector. The outputs of the phase detector are X and Y signals which control a charge pump in such a way as to reduce phase offset. The X and Y signals control the current flow from the charge pump into a low pass filter (LPF). The voltage on the LPF is a control voltage which determines the VCO frequency.

Referring to FIGS. 5A-C, signal Y, the output of the top XOR, is high when the first data sample (S1 in FIG. 5C) and the second data sample (S2 in FIG. 5C) are not equal. Signal X, the output of the bottom XOR gate, is high when the third data sample (S3 in FIG. 5B) is not equal to the second data sample (S2 in FIG. 5B). When X and Y are both low or both high, there is no transition in the data and therefore no phase differential information. Thus, when there is no transition in the data, and when X and Y are both being provided to drive the charge pump, the identical logical states of X and Y result in no net change in current into or out of the low pass filter, and therefore no net change in the VCO frequency.

When only X is high, the clock is sampling the data early. This scenario is represented in FIG. 5B. Specifically, the first data sample $S_1$ occurs before the rising edge of the positive pulse in DATA_IN, and the second data sample $S_2$ is to the left of the middle of the positive pulse in DATA_IN. As a result, the phase detector output causes the VCO frequency to decrease.

When only Y is high, the clock is sampling the data late. This scenario is represented in FIG. 5C. Specifically, the first data sample $S_1$ occurs after the rising edge of the positive pulse in DATA_IN, and the second data sample $S_2$ is to the right of the middle of the positive pulse in DATA_IN. As a result, the phase detector output causes the VCO frequency to increase.

The outputs of the phase detector act to cause the time of the second data sample $S_2$ to move closer to the middle of the positive pulse in DATA_IN, thereby acquiring phase lock and maximizing the margin before and after the sampling time $S_2$.

It should be appreciated that training data patterns that correspond to a higher transition density than a fully random data pattern can be used to increase the speed of frequency and phase locking.

Figure 6:
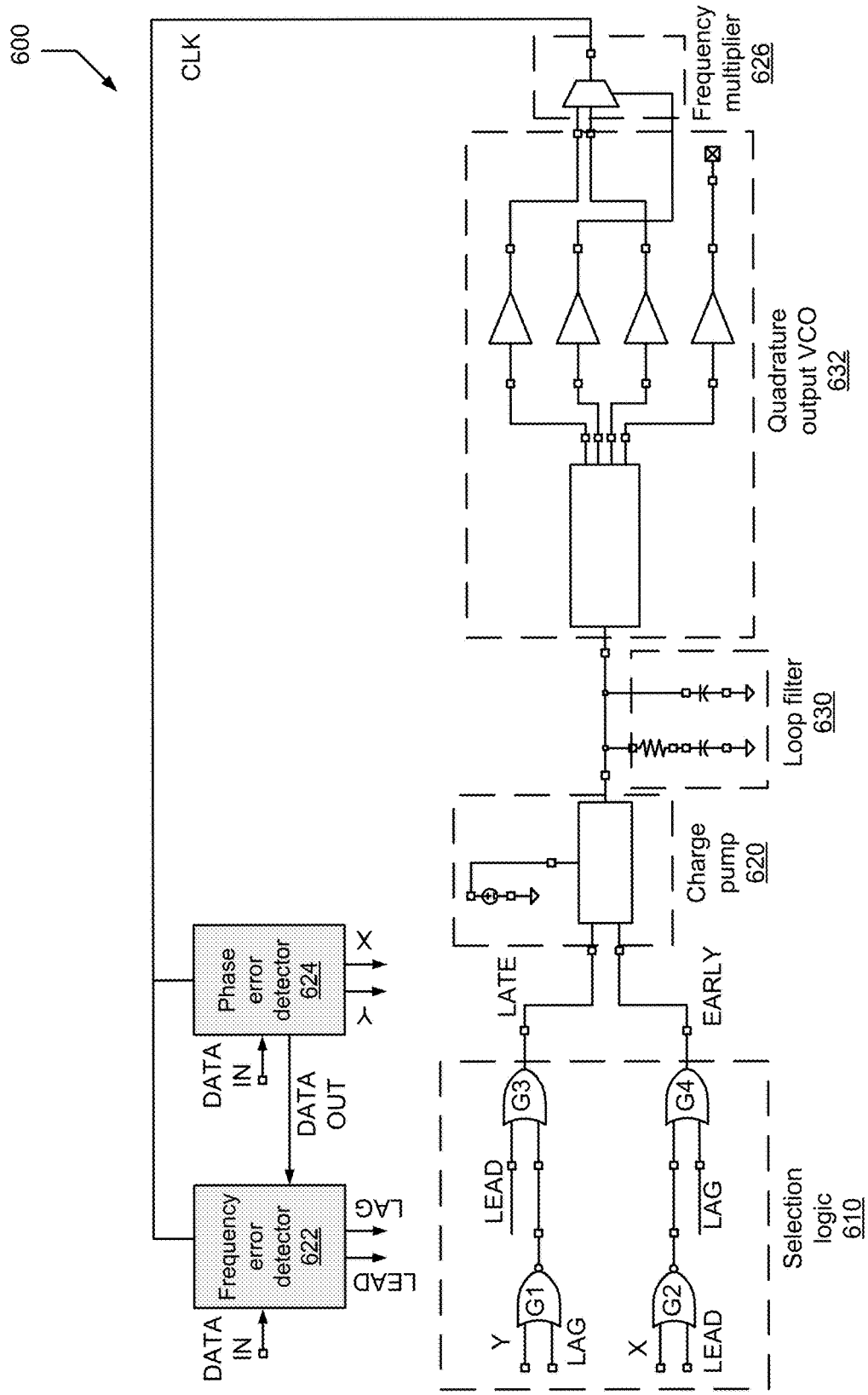
FIG. 6 is a simplified block diagram of a specific implementation of a clock and data recovery circuit.

FIG. 6 is an exemplary implementation of a clock and data recovery circuit 600. The clock and data recovery circuit 600 includes a frequency error detector as shown in FIG. 3, and a phase error detector as shown in FIG. 5.

Clock and data recovery circuit 600 further includes selection logic 610. Selection logic 610 receives signals X and Y from phase error detector 624, and receives signals LAG and LEAD from frequency error detector 622. Selection logic 610 includes four NOR gates, G1-G4, and outputs signals LATE and EARLY used to control charge pump 620 based on whether the VCO frequency corresponds to transitions that are late or early relative to the transitions in the DATA_IN signal.

Selection logic 610 provides a circuit interface for selecting whether the outputs of the frequency error detector or the outputs of the phase error detector are to be used for controlling charge pump 620. It should be appreciated that selection logic 610 can be implemented using different logic gates, for example, NAND gates, NOR gates, etc., and that the logic gates can be implemented using different logic families, for example, CMOS, TTL, etc.

When the outputs of the frequency error detector indicate that the difference in edge counts for the received signal and the recovered signal exceed the comparison threshold value, the outputs of the frequency error detector are used for controlling charge pump 620. For the implementation of FIG. 6, when the LEAD output of the frequency error detector is in a high state, the value of LATE is set to low, irrespective of the values of the output of the phase error detector. In such a scenario, the frequency error detector output indicates that the difference in edge counts exceeds the comparison threshold, and that the difference corresponds to the VCO frequency being late.

Similarly, when the LAG output of the frequency error detector is in a high state, the value of EARLY is set to low, irrespective of the values of the output of the phase error detector. In such a scenario, the frequency error detector output indicates that the difference in edge counts exceeds the comparison threshold, and that the difference corresponds to the VCO frequency being early.

When the LEAD output of the frequency error detector is in a low state, and the LAG output of the frequency error detector is in a low state, the frequency error detector is indicating that the difference in edge counts is within the comparison threshold, and selection logic 610 provides the outputs of the phase error detector as the inputs of the charge pump.

It should be appreciated that even after this frequency acquisition event, the frequency error detector can continue to run to detect loss of frequency lock. Alternatively, the frequency error detector can enter a low power mode after frequency acquisition. In one implementation of the low power mode, the frequency error detector stops counting the transitions in the received signal and recovered signal. In another implementation of the low power mode, the frequency error detector counts only rising edges or only falling edges, in contrast to counting both rising edges and falling edges prior to frequency acquisition. In yet another implementation of the low power mode, the frequency error detector alternates between a time interval where no transitions are being counted, and a time interval where only rising edges or only falling edges are counted.

When loss of frequency acquisition is detected, either LEAD or LAG transitions to a high state, thereby causing the output of the frequency error detector to be provided to the input of the charge pump.

When frequency lock is achieved, the outputs of the phase detector, X and Y, are provided to the charge pump 620 for phase-locking. For example, when there is no transition in the received data, X and Y are both low or both high, resulting in no net change in the low pass filter, and therefore no net change in the VCO frequency. During frequency lock, when only Y is high, corresponding to the clock sampling the data late, the LATE signal generated by selection logic 610 goes low and the EARLY signal goes high. This causes charge pump 620 to increase the charge in the low pass filter, and therefore cause the VCO frequency to increase.

Similarly, during frequency lock, when only X is high, corresponding to the clock sampling the data early, the EARLY signal generated by selection logic 610 goes low and the LATE signal goes high. This causes charge pump 620 to decrease the charge in the low pass filter, and therefore cause the VCO frequency to decrease.

Charge pump 620 changes the voltage on low pass filter 630 by adding or removing charge. The charge pump is controlled by the LATE and EARLY signals. The LATE and EARLY signals correspond to the Y and X signals, respectively, that are generated in the phase detector during phase acquisition. The LATE and EARLY signals correspond to the LEAD and LAG signals, respectively, that are generated by the frequency error detector during frequency acquisition. In some implementations, charge pump 620 supports a current of 100 µA.

If the LATE signal is low, the charge pump will add charge to the LPF, causing the control voltage for the VCO to increase and the VCO frequency to increase. If the EARLY signal is low the charge pump will remove charge from the LPF, causing the control voltage for the VCO to decrease and the VCO frequency to decrease. In certain implementations, charge pump 620 is implemented using current steering charge pumps. It should be appreciated that charge pump 620 can be implemented using single-ended or differential interfaces.

Low pass filter (LPF) 630, also referred to as a loop filter, attenuates high-frequency noise on the VCO control line and also stores charge corresponding to a control voltage for the VCO. A current controlled by charge pump 620 charges or discharges capacitor(s) and/or other charge storing elements in the LPF. This, in turn, changes the stored voltage in the low pass filter used to control VCO 632. It should be appreciated that filter designs having a variety of locations of the poles and zeros in the transfer function can be used. In one example implementation, the filter is a second order low pass filter. In certain implementations, the low pass filter has a loop bandwidth of approximately 9 MHz.

Voltage Controlled Oscillator (VCO) 632 outputs a signal which oscillates at a particular frequency based on a control voltage. It should be appreciated that implementations of VCO 632 suitable for clock and data recovery circuits have characteristics including low phase noise. The tuning range of VCO 632, together with any frequency dividers or multipliers, determines the data rates that can be locked onto. VCOs with high tuning ranges have high gain, which amplifies noise on the VCO control line, thereby leading to poor phase noise performance. Poor phase noise of a VCO increases the frequency domain analog of timing jitter, which increases bit error rates.

In certain implementations, VCO 632 uses a ring oscillator. The ring oscillator achieves oscillation via a series of delay stages where the output is connected to the input so that the circuit is unstable and oscillates. In certain other implementations, VCO 632 uses an LC oscillator. The LC oscillator is based on an LC tank circuit composed of an inductor and a capacitor. The inductor and the capacitor approximate lossless devices, and once energy is introduced to the system, the LC tank cycles at a particular frequency with only parasitic losses. It should be appreciated that the VCO outputs can be implemented using single phase or polyphase outputs. In certain implementations, the VCO has a gain of approximately 4 GHz per volt, a center frequency of 3 GHz, and quadrature phase output.

Frequency multiplier 626 following VCO 632 allows a variety of data rate ranges to be supported without the requirement for a wide tuning range for VCO 632. It should be appreciated that this includes implementations where the multiplication factor is greater than 1 (e.g., a frequency doubler), or a fraction of 1 (e.g., a frequency divider). In certain implementations, frequency multiplier 626 is a frequency doubler, allowing VCO 632 to operate at half frequency. This reduces VCO phase noise, offsetting the noise penalty incurred by using a frequency doubler. It should be appreciated that frequency multipliers can be implemented using single phase or polyphase inputs.

Frequency multiplier 626 outputs a signal CLK that is provided to frequency error detector 622 for synchronizing operations involving the edge counters, adder, negation, and comparison circuitry. The CLK signal is also provided to phase error detector 624 for synchronizing operations involving the flip-flops for sampling the incoming data signal and for generating the recovered data signal.

Circuitry in clock and data recovery circuitry 600 are arranged to form a feedback loop that results in frequency acquisition and phase acquisition of an incoming data signal. Selection logic 610, charge pump 620, loop filter 630, VCO 632, and frequency multiplier 626 are arranged in series. The output of this series configuration of circuitry, the CLK signal, is provided as an input to both the frequency error detector 622 and the phase error detector 624, which in turn generate the inputs for selection logic 610. It should be appreciated that frequency error detector 622 and phase error detector 624 do not have separate loop filters, therefore the risk of instability in the feedback loop due to mismatches between separate loop filters is avoided. As will be appreciated with reference to the foregoing, the present disclosure enables "referenceless" clock and data recovery circuits that may be characterized by one or more advantages relative to conventional clock and data recovery circuits. For example, in addition to increased stability, the size of the clock and data recovery circuit may be reduced compared to designs that have separate loop filters. The lack of a reference oscillator, along with the digital design of the frequency error detector, may also contribute to a reduction in power consumption and size.

It should be noted that certain implementations of referenceless clock and data recovery circuits as described herein meet the growing need for high data rate, compact, and low power receiver circuitry in mobile devices. Clock and data recovery circuits having such characteristics are important for the continuing evolution of serial standards. Various implementations described herein may be implemented using any in a variety of standard or proprietary CMOS processes. In addition, it should be noted that implementations are contemplated that may employ a much wider range of semiconductor materials and manufacturing processes including, for example, GaAs, SiGe, etc. Clock and data recovery circuits as described herein may be represented (without limitation) in software (object code or machine code in non-transitory computer-readable media), in varying stages of compilation, as one or more netlists (e.g., a SPICE netlist), in a simulation language, in a hardware description language (e.g., Verilog, VHDL), by a set of semiconductor processing masks, and as partially or completely realized semiconductor devices (e.g., an ASIC). Some implementations may be a standalone integrated circuit, while others may be embedded as part of larger system on a chip.

It will be understood by those skilled in the art that changes in the form and details of the implementations described above may be made without departing from the scope of this disclosure. In addition, although various advantages have been described with reference to some implementations, the scope of this disclosure should not be limited by reference to such advantages. Rather, the scope of this disclosure should be determined with reference to the appended claims.

What is claimed is:

1. A circuit, comprising:
   recovered clock generation circuitry configured to generate a recovered clock signal from a received signal using an oscillator, the recovered clock signal being for use in generating a recovered data signal from the received signal;
   frequency error detection circuitry configured to generate one or more outputs representing a relationship between a number of transitions of the recovered data signal and a number of transitions of the received signal;
   phase error detection circuitry configured to generate one or more outputs representing a relationship between transitions of the recovered clock signal and corresponding transitions of the received signal; and
   selection circuitry configured to provide at least one of the one or more outputs of the frequency error detection circuitry to the recovered clock generation circuitry for use in driving the oscillator if a difference between the number of transitions of the recovered data signal and the number of transitions of the received signal is above a threshold, the selection circuitry also being configured to provide at least one of the one or more outputs of the phase error detection circuitry to the recovered clock generation circuitry for use in driving the oscillator if the difference between the number of transitions of the recovered data signal and the number of transitions of the received signal is below the threshold.

2. The circuit of claim 1, wherein the oscillator comprises a voltage-controlled oscillator, wherein the recovered clock generation circuitry includes a charge pump and a capacitor that are configured to generate a control voltage for the voltage-controlled oscillator, and wherein the recovered clock generation circuitry is configured to use the one or more outputs of the frequency error detection circuitry or the one or more outputs of the phase error detection circuitry to drive the charge pump.

3. The circuit of claim 1, wherein the frequency error detection circuitry includes a first counter configured to count the transitions of the received signal, a second counter configured to count the transitions of the recovered data signal, difference circuitry for determining the difference between the number of transitions of the recovered data signal and the number of transitions of the received signal, and comparison circuitry for comparing the difference between the number of transitions of the recovered data signal and the number of transitions of the received signal to the threshold.

4. The circuit of claim 3, wherein the first counter is configured to count the transitions of the received signal by counting a number of rising edges of the received signal, a number of falling edges of the received signal, or a number of rising and falling edges of the received signal, and wherein the second counter is configured to count the transitions of the recovered data signal by counting a number of rising edges of the recovered data signal, a number of falling edges of the recovered data signal, or a number of rising and falling edges of the recovered data signal.

5. The circuit of claim 3, wherein the frequency error detection circuitry is configured to operate in a first mode in which the first counter is configured to count a number of rising or falling edges of the received signal, and the second counter is configured to count a number of rising or falling edges of the recovered data signal, and wherein the frequency error detection circuitry is configured to operate in a second mode in which the first counter is configured to count a number of rising and falling edges of the received signal, and the second counter is configured to count a number of rising and falling edges of the recovered data signal.

6. The circuit of claim 3, wherein the difference circuitry includes negation circuitry configured to invert the output of one of the first and second counters to generate an inverted counter output, and addition circuitry to add the inverted counter output to the output of the other of the first and second counters.

7. The circuit of claim 3, wherein the frequency error detection circuitry includes synchronization circuitry configured to synchronize operation of the difference circuitry and the comparison circuitry.

8. The circuit of claim 1, wherein the phase error detection circuitry is configured to generate the recovered data signal by using the recovered clock signal to sample the received signal.

9. The circuit of claim 1, wherein the received signal conforms to a serial data protocol, and wherein the serial data protocol corresponds to one of a DisplayPort standard, a High-Definition Multimedia Interface (HDMI) standard, a Serial ATA standard, a Peripheral Component Interconnect Express (PCI-E) standard, or a Universal Serial Bus (USB) standard.

10. The circuit of claim 1, wherein the frequency error detection circuitry is configured to enter a low power mode when the difference between the number of transitions of the recovered data signal and the number of transitions of the received signal is below the threshold.

11. The circuit of claim 10, wherein the frequency error detection circuitry is configured not to detect the transitions of the recovered data signal or the received signal during at least part of the low power mode.

12. The circuit of claim 10, wherein the frequency error detection circuitry is configured to detect only rising edges or only falling edges during at least part of the low power mode.

13. A circuit, comprising:
recovered clock generation circuitry configured to generate a recovered clock signal from a received signal using an oscillator, the recovered clock signal being for use in generating a recovered data signal from the received signal;
frequency error detection circuitry including one or more counters configured to count transitions of the received signal and transitions of the recovered data signal, and comparison circuitry for comparing a difference between a number of transitions of the recovered data signal and a number of transitions of the received signal to a threshold;
phase error detection circuitry configured to generate one or more outputs representing a relationship between transitions of the recovered clock signal and corresponding transitions of the received signal; and
selection circuitry configured to provide one or more outputs of the frequency error detection circuitry to the recovered clock generation circuitry for use in driving the oscillator if the difference between the number of transitions of the recovered data signal and the number of transitions of the received signal is above the threshold, the selection circuitry also being configured to provide at least one of the one or more outputs of the phase error detection circuitry to the recovered clock generation circuitry for use in driving the oscillator if the difference between the number of transitions of the recovered data signal and the number of transitions of the received signal is below the threshold.

14. The circuit of claim 13, wherein the oscillator comprises a voltage-controlled oscillator, wherein the recovered clock generation circuitry includes a charge pump and a capacitor that are configured to generate a control voltage for the voltage-controlled oscillator, and wherein the recovered clock generation circuitry is configured to use the one or more outputs of the frequency error detection circuitry or the one or more outputs of the phase error detection circuitry to drive the charge pump.

15. The circuit of claim 13, wherein the one or more counters includes a first counter configured to count the transitions of the received signal, and a second counter configured to count the transitions of the recovered data signal, and wherein the frequency error detection circuitry includes difference circuitry for determining the difference between the number of transitions of the recovered data signal and the number of transitions of the received signal.

16. The circuit of claim 15, wherein the difference circuitry includes negation circuitry configured to invert the output of one of the first and second counters to generate an inverted counter output, and addition circuitry to add the inverted counter output to the output of the other of the first and second counters.

17. The circuit of claim 15, wherein the frequency error detection circuitry includes synchronization circuitry configured to synchronize operation of the difference circuitry and the comparison circuitry.

18. The circuit of claim 13, wherein the one or more counters are configured to count the transitions of the received signal by counting a number of rising edges of the received signal, a number of falling edges of the received signal, or a number of rising and falling edges of the received signal, and wherein the one or more counters are configured to count the transitions of the recovered data signal by counting a number of rising edges of the recovered data signal, a number of falling edges of the recovered data signal, or a number of rising and falling edges of the recovered data signal.

19. The circuit of claim 13, wherein the one or more counters are configured to operate in a first mode to count a number of rising or falling edges of the received signal, and a number of rising or falling edges of the recovered data signal, and wherein the one or more counters are configured to operate in a second mode to count a number of rising and falling edges of the received signal, and a number of rising and falling edges of the recovered data signal.

20. The circuit of claim 13, wherein the phase error detection circuitry is configured to generate the recovered data signal by using the recovered clock signal to sample the received signal.

21. The circuit of claim 13, wherein the received signal conforms to a serial data protocol, and wherein the serial data protocol corresponds to one of a DisplayPort standard, a High-Definition Multimedia Interface (HDMI) standard, a Serial ATA standard, a Peripheral Component Interconnect Express (PCI-E) standard, or a Universal Serial Bus (USB) standard.

22. The circuit of claim 13, wherein the frequency error detection circuitry is configured to enter a low power mode when the difference between the number of transitions of the recovered data signal and the number of transitions of the received signal is below the threshold.

23. The circuit of claim 22, wherein the frequency error detection circuitry is configured not to detect the transitions of the recovered data signal or the received signal during at least part of the low power mode.

24. The circuit of claim 22, wherein the frequency error detection circuitry is configured to detect only rising edges or only falling edges during at least part of the low power mode.

\* \* \* \* \*